United States Patent
Lo

[19]

[11] Patent Number: 5,981,400
[45] Date of Patent: Nov. 9, 1999

[54] COMPLIANT UNIVERSAL SUBSTRATE FOR EPITAXIAL GROWTH

[75] Inventor: Yu-Hwa Lo, Ithaca, N.Y.

[73] Assignee: Cornell Research Foundation, Inc., Ithaca, N.Y.

[21] Appl. No.: 08/929,871

[22] Filed: Sep. 18, 1997

[51] Int. Cl.[6] .................................................. H01L 21/00
[52] U.S. Cl. .............................. 438/745; 117/97; 148/33; 216/34; 216/36; 438/694
[58] Field of Search .................... 438/745, 694; 216/2, 11, 34, 36, 83; 117/97; 148/33, 33.2, 33.4

[56] References Cited

U.S. PATENT DOCUMENTS

| | | |
|---|---|---|
| 3,962,716 | 6/1976 | Petroff et al. . |
| 4,088,515 | 5/1978 | Blakeslee et al. . |
| 4,704,785 | 11/1987 | Curran ................................. 438/753 X |
| 4,806,996 | 2/1989 | Luryi . |
| 5,115,286 | 5/1992 | Camras et al. . |
| 5,264,070 | 11/1993 | Urquhart et al. ......................... 117/97 |
| 5,294,808 | 3/1994 | Lo . |
| 5,371,037 | 12/1994 | Vonehara . |
| 5,374,581 | 12/1994 | Ichikawa et al. . |
| 5,695,557 | 12/1997 | Yamagata et al. . |

OTHER PUBLICATIONS

Powell, et al., "New Approach to the Growth of Low Dislocation Relaxed SiGe Material," Applied Physics Letters, vol. 64 (No. 14), pp. 1856–1858, (Apr. 4, 1994).

Carter–Coman, et al., "Strain–Modulated Epitaxy: A Flexible Approach to 3–D Band Structure Engineering Without Surface Patterning", Applied Physics Letters, vol. 69 (No. 2), pp. 257–259 (Jul. 8, 1996).

*Primary Examiner*—William Powell

[57] ABSTRACT

Compliant universal (CU) substrates and techniques for forming the same facilitate growth of epitaxial layers comprised of materials which are highly lattice mismatched with the substrate material. The CU substrates employ very thin (e.g., 1–20 nm or less) substrate layers which are loosely bonded to a thick bulk material base layer. Because of the loose bonding, the bonding energy of the atoms in the thin substrate layer is reduced, thus greatly increasing the flexibility of the thin substrate layer. This enables the substrate layer to absorb strain or stress imparted during the growth of lattice mismatched epitaxial layers, thus avoiding the formation of defects in the epitaxial layers. The "loose" bonding of the thin substrate layer to the base layer can be achieved in any of a number of ways. First, the thin substrate layer can be bonded at an angle relative to the base layer so that screw dislocations form which provide the desired reduction in bonding energy and increase in flexibility. Other techniques rely on reducing the top surface area of the base layer to reduce the bonding energy. This can be accomplished by making the base material porous at the top surface, or by patterning or roughing the top surface of the base layer.

24 Claims, 5 Drawing Sheets

COMPLIANT UNIVERSAL SUBSTRATE FOR EPITAXIAL GROWTH

BACKGROUND OF THE INVENTION

The present invention relates in general to substrates for facilitating epitaxial growth thereon of defect-free, lattice mismatched materials, and a process for fabrication of these substrates.

Over the past three decades, tremendous progress has been made in epitaxial growth of semiconductors. Some landmark achievements include the demonstration of quantum well and superlattice structures and most recently, strained quantum well structures. As a result of these accomplishments, the performance of electronic and optoelectronic devices has been improved by orders of magnitude. Particularly in the last five years, optoelectronics research has been largely focused on short wavelength (yellow, green, blue and ultraviolet) light sources produced from high bandgap semiconductor epitaxial thin films. However, high-quality commercial devices, such as yellow, green, blue and UV diode lasers, can not be made without high-quality material platforms serving as substrates for the epitaxial layers. Thus, while dozens of new epitaxial compound materials have been recognized for various important applications, suitable substrate materials for growing these epilayers on other than conventionally used Si, GaAs, InP and sapphire substrates have yet to be perfected. Without the proper substrate, these epilayers will have too many defects to produce reliable devices. This is because a majority of these new compound semiconductor epilayers do not have the same lattice constant and crystal structure as any of the existing semiconductor substrates, so that high quality epitaxial layers are very difficult to achieve.

One seemingly straightforward solution to this problem is to synthesize new lattice-matched substrates for these new compound semiconductors. However, developing a new substrate is not only technologically difficult but is also extremely costly in most cases. Consequently, the very limited availability of substrate materials has severely limited the types of compound semiconductors people can use to make devices. This problem is expected to be worse in the future as the research of epitaxial compounds is becoming more diversified to produce more materials, but the research and development of semiconductor substrates is taking an opposite trend and is becoming more focused. The advance of semiconductor substrates in the past decades has mainly been in Si which is moving rapidly towards 12" wafers, and to a much less degree, in GaAs and InP where 3" and 4" substrates are available. However, the development for other substrates lags far behind these three materials in terms of wafer size and defect density.

A fundamental solution to this problem is to synthesize a "universal substrate" that can support defect-free epitaxial growth of any compound semiconductors of different lattice constants. It is even more desirable if this "universal substrate" can be formed from Si, GaAs or InP, the three best developed substrates. One innovative concept disclosed in the inventor's previous patent, U.S. Pat. No. 5,294,808, issued Mar. 15, 1994, is the use of a thin substrate having a thickness on the same order as the critical thickness (the thickness above which dislocations form when growing one lattice mismatched material on another). Because the substrate is extremely thin, it can be viewed as a compliant substrate. That is, instead of governing the lattice constant of the epitaxial layers, the thin substrate becomes flexible enough to adapt itself to the epilayers grown thereon.

Both theoretical and experimental results indicated that the concept of the compliant substrate is correct and could fundamentally solve the problem of finding proper substrate for new epitaxial materials. However, one drawback in the previous invention is that it does not present a proper way of forming a compliant substrate that is scaleable and robust enough for commercial applications. In particular, with a substrate membrane of only a few hundred angstroms thickness as proposed in the inventor's previous patent, it is difficult to sustain the mechanical and chemical processes required for epitaxial growth and device fabrication. Furthermore, even the ideal compliant substrate constructed in accordance with the teachings of the '808 patent may only work for thin films of a relatively small lattice mismatch (e.g., <3%), but a lattice mismatch greater than 10% can often be found between semiconductor materials of significant interests. Therefore, to make compliant substrates more useful, not only is an effective implementation method needed, but a new type of compliant substrate is also needed which can accomodate large (e.g., 20%) lattice mismatch.

SUMMARY OF THE INVENTION

To address the foregoing concerns, the present invention provides compliant substrates that can be used universally for growing high-quality heteroepitaxy. These new "compliant universal (CU) substrates" are intended to replace all existing III-V binary substrates which can only support compound semiconductor materials of specific lattice constants.

The CU substrates constructed in accordance with the various embodiments of the present invention permit growth of defect-free epitaxial thin films of large lattice mismatch (e.g., 20% or more) with the substrate material. Use of these CU substrates eliminates the critical thickness limitation imposed in previous epitaxial growth techniques. In all embodiments of the present invention, the CU substrates are preferably, but need not be, formed from conventional substrate materials, such as Si, GaAs, InP, SiC and GaP, for example. The CU substrates thus have very similar thermal, optical and electrical properties to those of conventional substrates since they are formed from the same materials, however, the lattice structure of the surface atoms is specifically engineered to be exceedingly flexible under strain. The technique employed to accomplish this is referred to as "lattice engineering". In lattice engineering, a very thin substrate, such as one disclosed in the inventor's previous patent, is "loosely bonded" to a bulk material base layer. It should be stressed that the phrase "loosely bonded" does not imply that the thin substrate layer can easily separate from the base layer. The phrase simply means that the bonding energy of the atoms in the bonding interface between the thin layer and the bulk material base layer is notably lower than the bonding energy of the atoms within either the bulk material or the thin layer. This provides the desired flexibility of the atoms in the thin substrate so that the thin substrate can be elastically or plastically deformed subject to strain from epitaxial layers grown thereon.

In a first embodiment of the present invention, a conventional substrate is converted into a CU substrate via lattice engineering by applying a direct wafer bonding process to bond a thin (e.g., 20 nm or less) layer to a bulk material base layer with the crystal orientation of the thin layer positioned at an angle relative to that of the bulk material to form a new platform for epitaxial growth. As a result of the different crystal orientation, a 2D array of screw dislocations is formed at the bonding interface which are strictly confined to the twist boundary plane. Regions enclosed by the screw dislocations have properties similar to the properties of a bulk crystal, but the atoms at the screw dislocation cores are substantially displaced from their equilibrium positions, and thus have different properties from those of the atoms in a bulk crystal. In particular, the lattice of the screw dislocation cores is severely distorted in a manner that reduces the bonding energy of the atoms, and makes the atoms in these regions exceedingly flexible. As the angle between the bonded thin layer and the bulk material base layer increases, the spacing between screw dislocations is reduced so that at a large enough angle, almost all atoms except a few are flexible to accommodate the large lattice strain which results from heteroepitaxial growth. Thus, epitaxial layers formed from materials which are highly lattice mismatched with the substrate material may now be grown on the substrate to thicknesses far beyond the critical thickness without the formation of threading dislocations in the epitaxial layers. This is because substantially all of the strain imparted between the substrate and the epitaxial layers during the growth process is absorbed by the flexible screw dislocation cores at the bonding interface, which can be viewed, in general, as an ultrathin interfacial region between the thin substrate and the bulk material base.

In a first preferred technique for fabricating the CU substrate with the angled thin layer, a high quality thin film to be used as the compliant substrate is formed on a first wafer using conventional techniques. A second wafer is provided which will act as the bulk material base layer. The first wafer is then bonded to the second wafer with the thin film layer's crystal orientation rotated or twisted at an angle with respect to the crystal orientation of the second wafer. Any suitable bonding technique, such as pressure bonding, hydrogen bond, covalent bond, etc., is employed to join the wafers, thereby forming a "twist" boundary between the two. The first wafer is then removed by selective etching techniques so that the exposed thin film can now be used as a CU substrate platform for epitaxial growth.

It should be stressed here that forming a twist boundary is just one of many ways to make CU substrates. For example, based on similar principles, a tilt boundary can be formed by bonding a thin layer to a bulk crystal with a miscut in the crystal orientation. As an example, an (100) on-axis thin layer can be bonded to an (100) substrate with a 3° miscut on the (110) axis. Alternatively, a bicrystal domain boundary can be formed by, for example, bonding a (111) thin layer to a (100) bulk crystal or vice versa. In addition, the thin layer and the bulk crystal do not have to be of the same material. Such structures such as a GaAs compliant thin layer on InP, a GaAs compliant thin layer on Si, and an SiC compliant layer on Si can also be formed as compliant substrates.

In a second embodiment of the present invention, the CU substrate is formed by bonding the thin film on a porous base. Porous silicon, for example, is composed of a matrix of nanometer-scaled single crystal columns. The effective top surface area, excluding the side walls, of a bulk base layer formed from porous silicon is substantially less than that of a normal silicon surface due to these columns. When the thin film is bonded to the porous silicon surface, the resulting bonding energy is approximately proportional to the effective surface area, and thus will also be substantially lower. This lower bonding energy thus provides the flexibility required to enable the thin film to act as a compliant substrate. It can be envisioned that the porous silicon is made of nanometer diameter silicon crystal posts. Under stress imposed by the heteroepitaxial overlayer, the nanometer posts may slip or be plastically deformed to introduce misfit dislocations for strain release. The vulnerability of these nanometer posts in porous silicon keeps the heteroepitaxial overlayer intact during the strain release process which would otherwise generate a high density of threading dislocations in the overlayer. Preferably, this embodiment of the invention is implemented by forming a thin porous layer in the bulk material base using an anodic etching process.

In a third embodiment of the present invention, reduced bonding energy between the thin film and the bulk material base layer is achieved through microscopic surface patterning of the base layer which results in a similar effect to that produced by the porous material in terms of bonding energy and interfacial layer thickness. To avoid jeopardizing the robustness of the bonded thin film, the surface features of the patterned substrate must have sizes in the nanometer range. Since no known lithographic techniques can generate such a feature size over the entire substrate surface at a reasonable cost, these features can be formed using the material properties of self-organization. More specifically, a self-organized pattern of material is deposited on the base layer's top surface. Than the surface is uniformly etched, thereby leaving the pattern in the top surface.

Yet another embodiment of the present invention achieves the reduced bonding energy between the bulk material base layer and the thin film by forming microscopically roughened surfaces on the base prior to bonding of the thin film thereto. This surface roughness can be created in many ways, including dipping the bulk Si material base in KOH solution, or immersing it in still, uncirculated deionized (DI) water which can create a surface roughness of a few hundred angstroms or less.

To summarize, all of the embodiments of the present invention attempt to make the thin compliant substrate layer as prone to elastic or plastic deformation as possible. In other words, the thin compliant layer provides an energetically more favorable channel for lattice strain release than the traditional way, which generates threading dislocations and stacking faults in the heteroepitaxial overlayer.

BRIEF DESCRIPTION OF THE DRAWINGS

The features and advantages of the present invention will become apparent from the following detailed description of a number of preferred embodiments thereof, taken in conjunction with the accompanying drawings, in which.

DETAILED DESCRIPTION OF THE PREFERRED EMBODIMENTS

Figure 1:
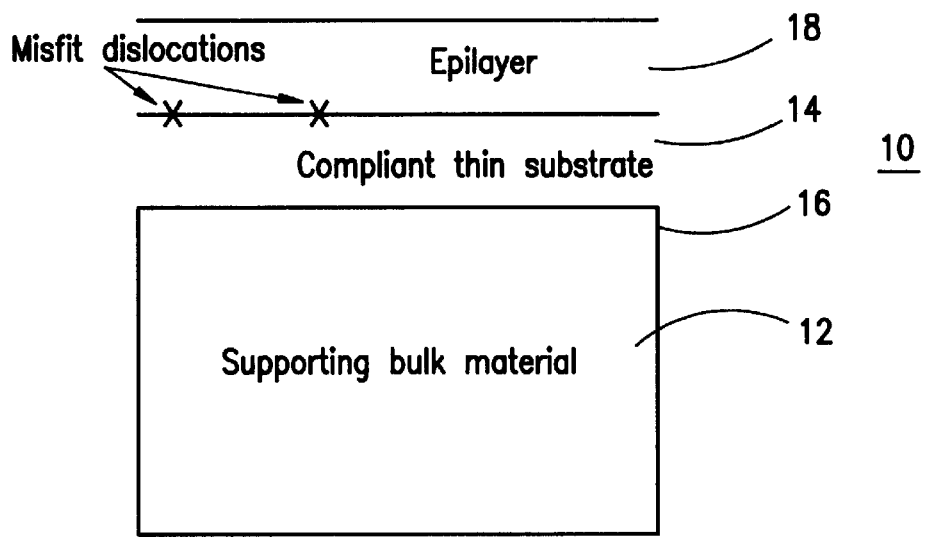
FIG. 1 is a schematic diagram illustrating a generic layered structure employed in all embodiments of the present invention to form defect-free epitaxial layers on compliant thin substrates.

Turning now to a detailed consideration of a number of preferred embodiments of the present invention, FIG. 1 illustrates a generic compliant universal (CU) substrate 10 which may be constructed in accordance with any of the preferred embodiments. The CU substrate 10 is a multiple layer structure comprised of a thick bulk material base layer 12 and a compliant thin film substrate layer 14 which is bonded to the bulk material base layer 12 at a bonding interface 16. The compliant thin film substrate layer 14 serves as the actual substrate which supports an epitaxial layer or epilayer 18 grown thereon. As in the invention disclosed in the inventor's previous patent, U.S. Pat. No. 5,294,808, which is hereby incorporated by reference, the substrate layer 14 preferably has a thickness on the order of 20 nm or less. However, in the embodiments of the present invention, the substrate layer 14 is mechanically robust because it is bonded to the base layer 12. It should be noted that the bonding interface 16 may actually comprise an thin interfacial layer which may vanish or be as thin as one atomic layer or as thick as a few thousand angstroms or more.

The bulk material base layer 12 can be formed from any commercially available substrate material, such as Si, GaAs, InP, SiC and GaP, for example. However, it should be noted that materials other than semiconductors or single crystal materials may also be employed for the base layer 12. It should also be noted that the thin film substrate layer 14 can be made from either the same or a different material than that employed in the base layer 12.

Theoretical analysis has been conducted which shows that when the thin film substrate layer 14 is "loosely" bonded to the supporting bulk material base layer 12, or the base layer 12 is much softer or flexible than the substrate layer 14, the substrate layer 14 becomes more compliant. It should be emphasized that the fact that the thin film substrate layer 14 is "loosely" bonded to the base layer 12 does not mean that the thin film substrate layer 14 could be easily peeled off of the base layer 12. As a matter of fact, the actual bonding strength between the substrate layer 14 and the base layer 12 can be nearly as large as the internal bonding strength of the bulk material comprising the base layer 12. Via the lattice engineering employed in the preferred embodiments of the present invention, the lattice of the bonded thin film substrate 14 can be made highly flexible without weakening the mechanical strength of the resulting CU substrates. Thus, the phrase "loosely bonded" means that the bonding energy in the interface between the atoms in the base layer 12 and the atoms in the substrate layer 14 is lower than the bonding energy of the atoms in either the base layer 12 or the substrate layer 14 themselves. However, the actual mechanical strength of the bond between the base layer 12 and the substrate layer 14 is not notably lower.

Assuming that a misfit dislocation is generated due to lattice mismatch between the substrate layer 14 and the epilayer 18, the misfit dislocation may be nucleated in the epilayer 18 as in the case of conventional growth or be nucleated in the substrate layer 14. One certainly prefers the latter since the quality of the epilayer 18 is of prime interest. A misfit dislocation at the epi-substrate interface experiences two image forces, one from the epi-side and one from the substrate-side. Since the magnitude of image force that drives the dislocation decays with the increasing distance between the dislocation and the free surface, a very thin substrate is preferred so that the image force from the substrate side becomes more dominant. However, if the thin film substrate layer 14 is tightly bonded to the supporting bulk material base layer 12, the two can be treated as one thick entity and the image force from the substrate side will be nearly zero.

Figure 2:
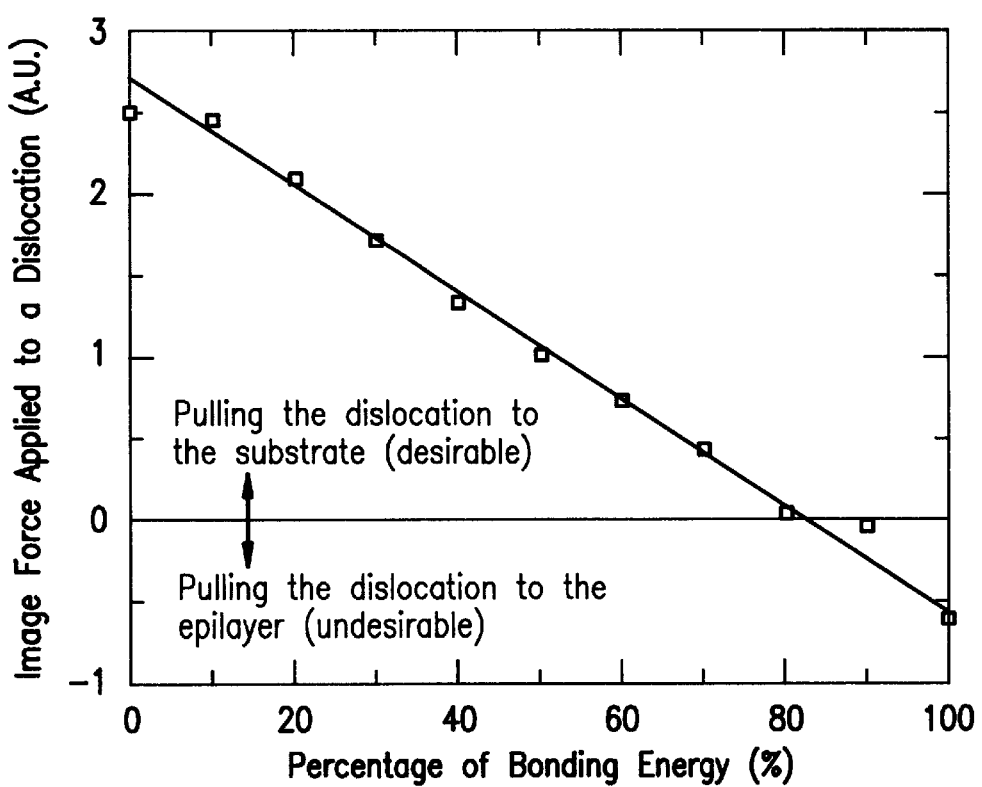
FIG. 2 is a graph illustrating the net image forced applied to a misfit edge dislocation as a function of percentage of bonding energy between a thin substrate layer and a supporting bulk material base layer.

FIG. 2 shows the calculated result of the dependence of the net image force experienced by a misfit dislocation on the strength of the bonding energy at the substrate/base interface 16. 100% bonding means that the thin film substrate layer 14 and the supporting bulk material base layer 12 become one entity, and 0% bonding means that the substrate layer 14 is completely free from the supporting base layer 12. In our sign convention, positive image force means that the dislocation tends to be driven into the thin film substrate layer 14, this being a desirable situation. Negative net force represents that the misfit dislocations tend to move as threading dislocations into the epitaxial layer 18 as in the conventional case, this being an undesirable result. For a given substrate thickness, the intersect with the zero-force line defines a critical effective bonding energy beyond which the thin film substrate layer 14 can no longer prevent dislocations from propagating into the epilayer 18.

Note that the above theory is developed based on the assumption that misfit dislocations have been created at the epilayer/substrate layer interface. The key issue that determines the compliance of the substrate is if the driving force will pull the dislocations into the substrate. This is a concept of sacrificial substrate since, after epitaxial growth, defectless epitaxial layers can be achieved at the expense of the substrate which collects all of the dislocations. Image force represents only one factor in favor of nucleating defects in the thin substrate instead of in the overlayer. Other mechanisms, such as creating slips, microcracks and other types of plastic deformation in the thin substrate layer also contribute to the compliance function of the substrate. However, there is another domain of operation where the strain field will not be large enough to create any misfit dislocations. A detailed discussion of this is contained in the inventor's previous patent, U.S. Pat. No. 5,294,808. The same concepts can be applied to do the analysis and obtain the same conclusion. That is, the effective substrate thickness will be influenced by the bonding energy in the same manner as when misfit dislocations do occur. In real applications, misfit dislocations often occur when the lattice mismatch between the substrate layer 14 and the epilayer 18 is relatively large, whereas the dislocation-free situation more likely happens to materials with a relatively small lattice mismatch.

Figure 3A:
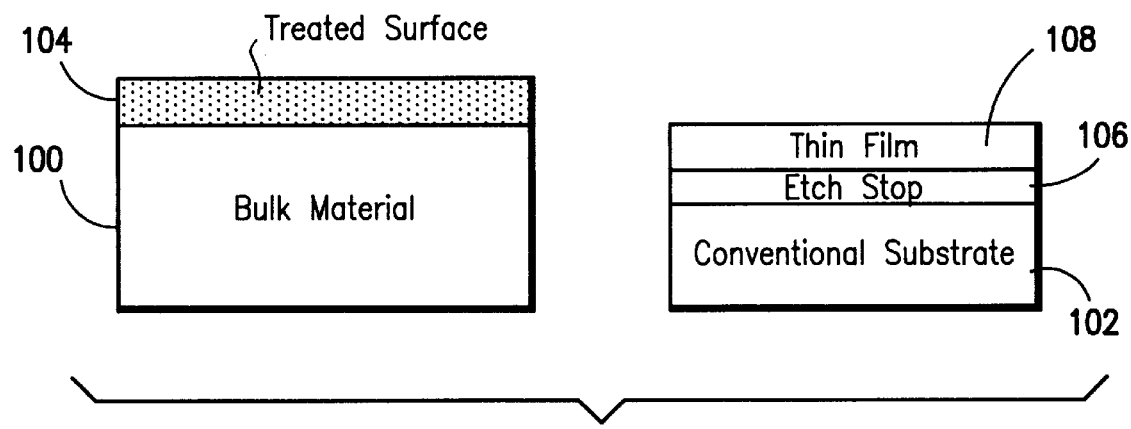
FIGS. 3A, 3B and 3C are schematic illustrations of the process employed to fabricate a CU substrate in accordance with the preferred embodiments of the present invention.
Figure 3B:
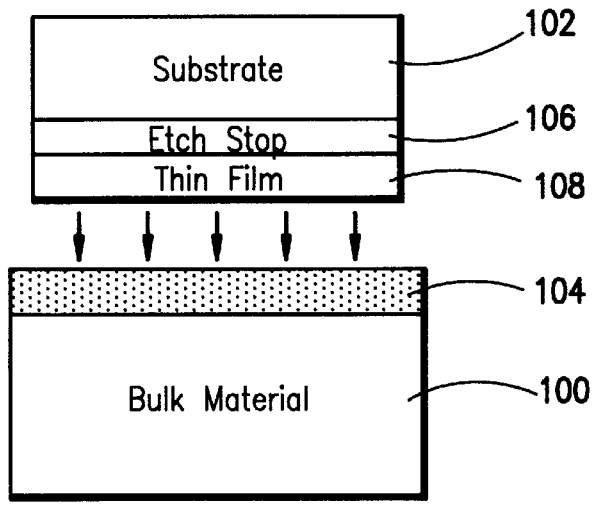
Figure 3C:
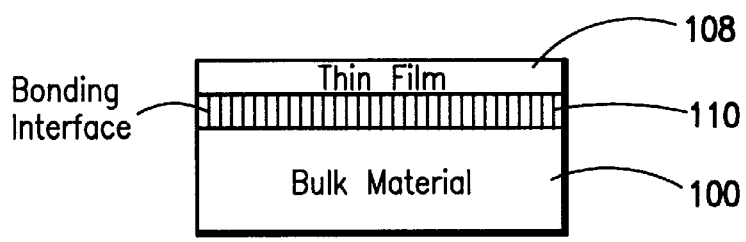

FIGS. 3A–C illustrate the basic process flow approximately followed by all of the embodiments of the present invention. As illustrated in FIG. 3A, first and second wafers 100 and 102 are provided, each of which is formed from a suitable bulk substrate material, such as Si, GaAs, InP, SiC or GaP, for example. Once again, it should be stressed that any suitable material may be employed as the substrate material, including both semiconductors and non-semiconductors. Depending upon which of the preferred embodiments of the present invention is being employed, the first wafer 100 may undergo a surface treatment process to form a treated top surface 104 thereon. In all embodiments of the present invention, an etch stop layer 106 is formed on the second wafer 102, after which a thin film substrate layer 108 is formed thereon using any suitable conventional technique.

Next, as illustrated in FIG. 3B, the second wafer 102 is inverted relative to the first wafer 100, and the thin film substrate layer 108 is bonded to the top surface 104 of the first wafer 100. The joining of the two wafers 100 and 102 can be via Van der Waals force, hydrogen bond, covalent bond, ionic bond or other mechanisms, and results in formation of a bonding interface 110 which may, but need not, comprise a finite thickness interfacial layer. In some cases, pressure can be applied during the wafer bonding process. Depending on the detailed process conditions and bonding mechanisms, the applied pressure can vary from zero to over 100 MPascal. Finally, as illustrated in FIG. 3C, the second wafer 102 is removed by selective etching techniques, so that the exposed thin film substrate layer 108 can be used as a compliant substrate platform for epitaxial growth, while the first wafer 100 now becomes the supporting bulk material base layer.

The following preferred embodiments of the present invention represent four different approaches to insuring that the thin film substrate layer 108 is compliant enough to permit growth of defect-free lattice mismatched epitaxial layers thereon.

(1) Thin film substrate on differently oriented materials

The central idea of forming a CU substrate is to create a thin template with highly flexible lattice structures to accommodate epitaxial films of different lattice constants. Here it should be stressed that the lattice flexibility is not via a change of the lattice constant uniformly across the template. Instead, the "lattice flexibility" refers to local changes of lattice at an atomic scale via "lattice engineering" techniques. Two important points to remember in the design of compliant universal substrates for epitaxial growth are: 1) the substrate needs to be loosely bonded to or released from the material underneath, and 2) the substrate needs to be very thin. In the first preferred embodiment of the present invention, the crystal structure of the substrate material itself is employed to define the feature size, and the microstructures of "twist boundaries" or "tilt boundaries" at the bonded crystal interface are used to achieve the desirable lattice compliance properties. Using this scheme, the substrate surface appears to be the same as a standard substrate except that microscopically, the atoms on and near the surface become much more "flexible", hence much more compliant to the material grown thereon.

Formation and microstructures of twist or tilt boundaries

Figure 4A:
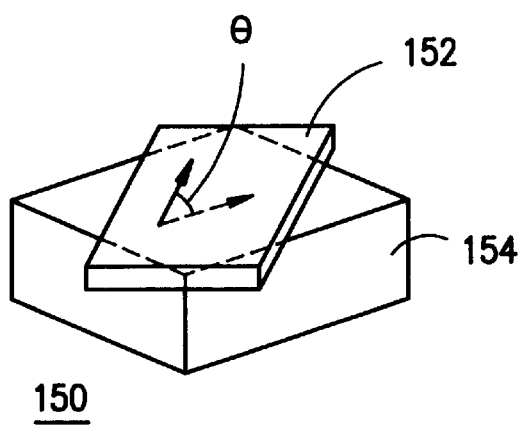
FIGS. 4A and 4B are schematic illustrations of a CU substrate constructed in accordance with a first preferred embodiment of the present invention.
Figure 4B:
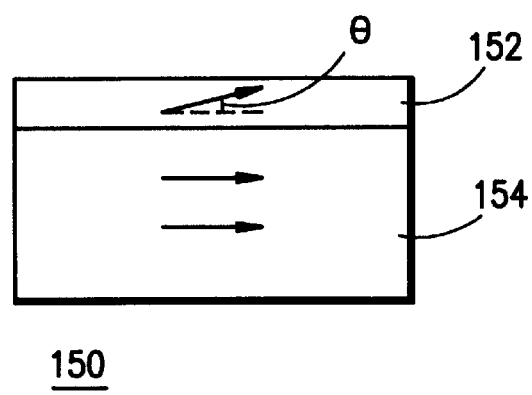

With reference to FIGS. 4A and 4B, a CU substrate 150 is illustrated comprising a thin film substrate layer 152 and a supporting bulk material base layer 154, which may be made of the same kind or different kinds of material in this embodiment. Examples of different combinations of materials which can be employed for the substrate layer 152/base layer 154 include, but are not limited to, the following: GaAs/InP, GaAs/Si and SiC/Si. The most important feature is that the two materials forming the substrate and base layers have a different crystal orientation. The different crystal orientation may occur in the surface normal direction as illustrated in FIG. 4A (e.g. (100) GaAs bonded to (111) GaAs), or in the in-plane direction (e.g. two (100) GaAs with an angle between their [110] axes), or in both surface normal and in-plane directions. Furthermore, a tilt, rather than twist, boundary may be formed between two materials by bonding a thin layer to a bulk crystal with an off-axis cut in its crystal orientation. FIG. 4B illustrates such a variation in which the arrows indicate the direction of the crystal orientation for the layers 152 and 154. For example, an (100) on-axis thin layer can be bonded to an (100) substrate with a 3° off-axis cut along the (110) axis. Additionally, a bicrystal domain boundary can be formed, for example, by bonding an (111) thin layer to an (100) bulk crystal.

For convenience of discussion, assume that the bonded thin film substrate layer 152 and the bulk material base layer 154 have the same surface normal orientation but an angle $_\theta$ between their in-plane [110] axes as illustrated in FIG. 4A. After wafer bonding, a twist boundary is formed at the bonding interface. On the plane of the twist boundary, there forms a two dimensional array of screw dislocations spaced from one another by from hundreds of angstroms to a few angstroms, depending on the angle $_\theta$ between the thin film substrate layer 152 and the bulk material base layer 154.

The spacing (d) between two adjacent screw dislocations can be described as $$d = b/2 \sin(_\theta/2) \qquad (1)$$

where b is the Burgers vector for screw dislocations, and $_\theta$ is the angle between two bonded samples.

Near screw dislocation cores, the atoms are deviated substantially from their normal positions. When the twist angle is increased, screw dislocations become closer to each other according to Eq. (1) and finally overlap. In this case, the atoms at the top are very poorly aligned to those at the bottom and the lattice of the top crystal is highly distorted, this being most favorable to substrate compliance.

Principles for Substrate Compliance

A bonded thin layer with screw dislocations at the bonding interface behaves as a compliant substrate for the following reasons. When the top and bottom atoms are largely misaligned, some atoms become rather flexible in the surface normal direction. On the other hand, in the areas enclosed by screw dislocations, atoms are well aligned as in bulk crystal so there is no such flexibility. Hence, these atomically aligned regions function as anchored regions. Although the width of each screw dislocation core (unaligned region) is relatively fixed (on the order of 1 nm), the size of the anchored regions can be easily controlled by the relative angle between the two bonded materials according to Eq. 1. When the angle increases, the spacing between the screw dislocations is reduced and the isolated "anchored" regions shrink and eventually vanish to form a so-called coincident site lattice (cs1). This will create a nearly ideal compliant substrate since the whole area, except an array of small islands, becomes very flexible.

Initial Experimental Confirmation of the Theory

Some simple experiments were carried out to test the effectiveness of the approaches. In the first experiment, 3000 Å thick In0.35Ga0.65P (1% tension) was grown on both a conventional GaAs (100) substrate and on a 100 Å thick GaAs template bonded with a 32° twist angle to a (100) GaAs substrate. The classical M-B model predicts a critical thickness of about 100 Å and the more recent model predicts a metastable critical film thickness of 140 Å. As expected, threading dislocations and stacking faults occurred in the heteroepitaxy grown on the bulk GaAs substrate. However, neither threading dislocations nor stacking faults were found over the entire sample for heteroepitaxy grown on the 100 Å twist-bonded template, even though the lattice of the InGaP layer has been relaxed to its equilibrium value. This sharp contrast clearly confirms the effectiveness of the proposed first preferred embodiment.

To test the capability of substrate compliance, a further experiment was conducted for growing 3000 Å thick GaSb (8% lattice mismatch) on a 100 Å thick GaAs twist-bonded template. Amazingly, in spite of very serious lattice distortion at the interface between the GaSb and the 100 Å GaAs bonded layer, hardly any dislocations were created in the GaSb, even in regions a few hundred angstroms from the heterointerface. The only few defects observed were not originated from the growth interface and were suspected to be due to non-ideal growth of the GaSb material itself. This is drastically different from the GaSb heteroepitaxy grown directly on GaAs bulk substrates where dislocation densities on the order of $10^{10}$–$10^{11}$ cm$^{-2}$ exist in the first 1000 Å GaSb layer.

Other experiments with the "twist bonded" embodiment of the present invention appear to indicate the presence of a very intriguing characteristic. In particular, it appears highly likely that after formation of the epilayers on the CU substrate, the original twist between the thin substrate layer and the thick base layer is no longer present. In other words, as the epitaxial layers are grown on the substrate, the thin substrate layer untwists relative to the base layer. It is not completely clear why this occurs, however, it is known that the twist boundary is a rather metastable state as opposed to an equilibrium state, so that there is in fact a tendency for the boundary to untwist. The disappearance of the twist boundary could be caused by generation of screw dislocation arrays of an opposite orientation to those at the twist boundary, or by dislocations climbing due to vacancies and the dislocation image force that drives the dislocations to the surface. The later process is more likely to happen because of the lower required energy therefor. The lattice strain produced by the deposited heteroepitaxial layer could trigger this untwist process. As a result, the heteroepitaxial layer will not only be defect-free, but will also have the same orientation as the bulk material in the base layer, as if the twist bonded thin substrate layer does not even exist. It has been observed experimentally that this untwisting effect does in fact occur after epitaxial growth, yet the epitaxial film remains to be defect-free in spite of the lattice mismatch, this being attributed to substrate compliance. This is a very advantageous aspect of the invention since for many device applications, having the same orientation between the epitaxial layer and the base layer could greatly facilitate the device processing. For example, lasers grown on such twist bonded compliant substrates can now have cleaved mirrors because of the automatic untwist.

It is important to stress, however, that although the untwist phenomenon is attractive, it could make the compliant substrate ineffective if the untwist occurs too soon, before the growth of the heteroepitaxial layers. If the untwist process is completed during sample heating or native oxide desorption, for example, the twist-bonded thin substrate layer will become part of the bulk material base layer, thus completely eliminating the compliance of the substrate layer. It has been observed that when the twist-bonded thin substrate layer becomes extremely thin, the tendency of untwisting before growth starts is stronger. Thus, the solution to this problem is to control the growth condition and to improve the uniformity and quality of the bonded thin substrate layer.

The following additional findings have been made regarding fabrication of the so called twist-bonded CU substrate. In particular, it has been found that it is critical to maintain the integrity of the twist-bonded substrate layer during the process of substrate and epitaxial growth. The following are some key steps which should be observed. First, formation of thick native oxide on the thin substrate layer must be avoided. Standard processes, such as an extensive deionized (D.I.) water rinse, could over oxidize the surface of the thin substrate layer, which may completely dissipate the substrate layer. In one example, a 30 Å GaAs twist-bonded compliant substrate was completely oxidized after a D.I. water rinse of 10 to 15 minutes. To insure this does not occur, it is therefore recommended that a D.I. water rinse of no more than approximately 1 minute be employed.

It is also very important to control mass transport during bonding of the thin substrate layer to the base layer. To obtain a high quality, uniform bonding interface, high temperature and high pressure are both preferred. The mass transport process of the surface atoms join the two surfaces into one, creating the so called "twist boundary" if the two layers are bonded at an angle with respect to one another. However, it is also the mass transport process that may transfer the atoms in the thin substrate layer to the thick base layer. As a result, the originally uniform thin substrate layer may be converted into small grains with different angles which may be undesirable for epitaxial growth. To control the mass transport, bonding temperature and pressure should be properly adjusted for different materials.

(2) Thin film substrate on porous materials

Figure 5:
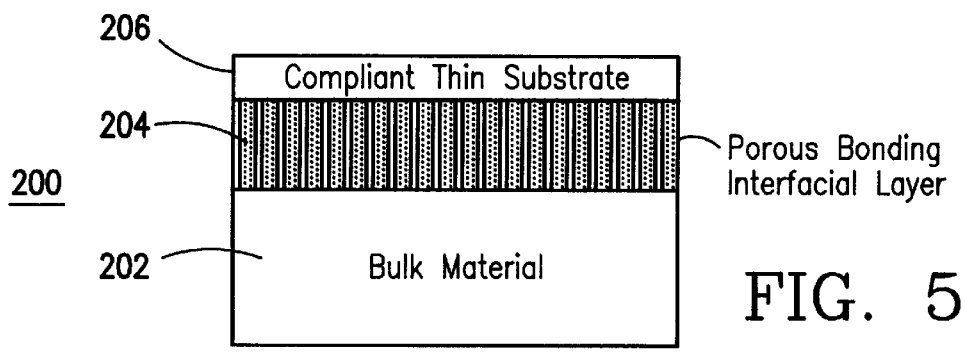
FIG. 5 is a schematic diagram of a CU substrate constructed in accordance with a second preferred embodiment of the present invention.

In the second preferred embodiment of the present invention, the top surface of a bulk material wafer is treated so that it is porous, thus allowing precise control of the bonding energy and the interfacial layer thickness between the thin film substrate layer and the bulk material base layer. FIG. 5 illustrates a CU substrate 200 constructed in this manner. The CU substrate 200 is comprised of a thick, bulk material base layer 202 having a top, porous region 204 formed therein which is bonded to a compliant thin film substrate layer 206. The porous region 204 thereby acts as a bonding interfacial layer of finite thickness.

Since the technology of forming porous silicon has been very well documented, silicon can be used as an example to illustrate this method. A single crystal of silicon can be made porous without losing the integrity of its crystal structure. Experimentally, it has been found that porous silicon is composed of a matrix of nanoscaled single crystal columns. Although the size of these columnar structures is random and processing dependent, it is estimated to be around 3 nm in diameter. For porous silicon that has a density which is 50% that of bulk silicon, the effective top surface area, excluding the side walls, is about 50% of a normal silicon surface. When a thin film is bonded to such a surface, the bonding energy should be approximately proportional to the effective surface area assuming that the porosity does not change much during the bonding process. Therefore, the bonding energy is approximately scaled with the density of the porous material which can be controlled by the fabrication process and easily measured. The thickness of the porous top region 204, or equivalently, the thickness of the interfacial layer, can also be controlled. For instance, a porous silicon layer of from a few hundred angstroms to approximately 1 micrometer can be obtained using an anodic etching process.

(3) Thin film substrate on microscopically patterned materials

Microscopic surface patterning can also be used to generate a similar effect as the porous material in terms of bonding energy and interfacial layer thickness. The challenge is that, to make substrate compliant without jeopardizing the robustness of the bonded thin film, the surface features have to be in nanometer scales. For porous silicon, the feature size is in the order of 3 nm. No lithographic techniques can generate such feature size over the entire surface at a reasonable cost. However, using the peculiar material properties of self-organization, one can form super fine two-dimensional features over a large area quite easily without a lithographic process.

Figure 6A:
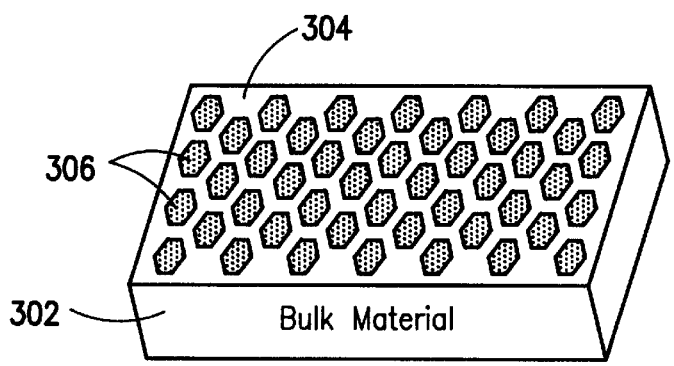
FIGS. 6A–6C are schematic diagrams illustrating the formation of a CU substrate constructed in accordance with a third preferred embodiment of the present invention.
Figure 6B:
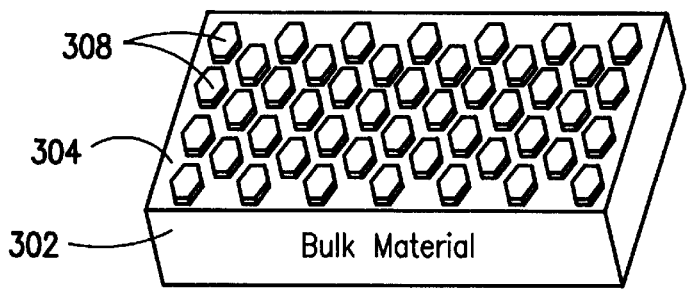
Figure 6C:
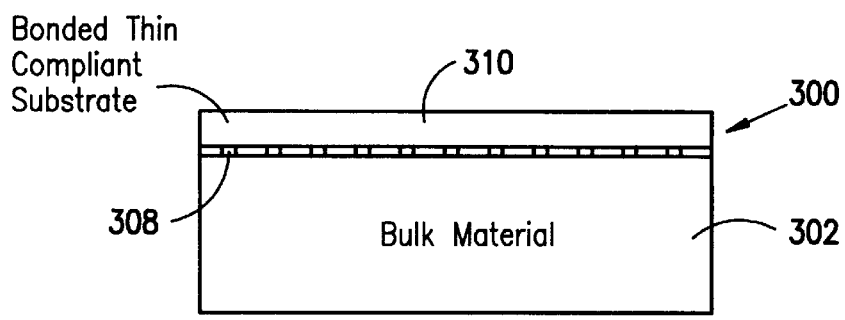

FIGS. 6A–C illustrate a technique for fabricating a CU substrate 300 using this self-organized microscopic patterning technique. First, a bulk material wafer 302 is provided which will act as the base layer for the CU substrate 300. The wafer 302 includes a top surface 304 on which a pattern 306 of self-organized material is deposited. Next, a conventional dry etching technique is employed to transfer the pattern 306 to the top surface 304, through removal of a uniformly thick layer of material. This results in formation of a patterned top region 308 in the top surface 304 which effectively forms a bonding interfacial layer. Finally, a thin film compliant substrate layer 310 is bonded to the bulk material base layer 302 using the same techniques employed in the previous embodiments. This patterning technique thereby provides a compliant substrate platform with well controlled bonding energy and interfacial layer thickness.

(4) Thin film substrate on microscopically roughened surfaces

Figure 7:
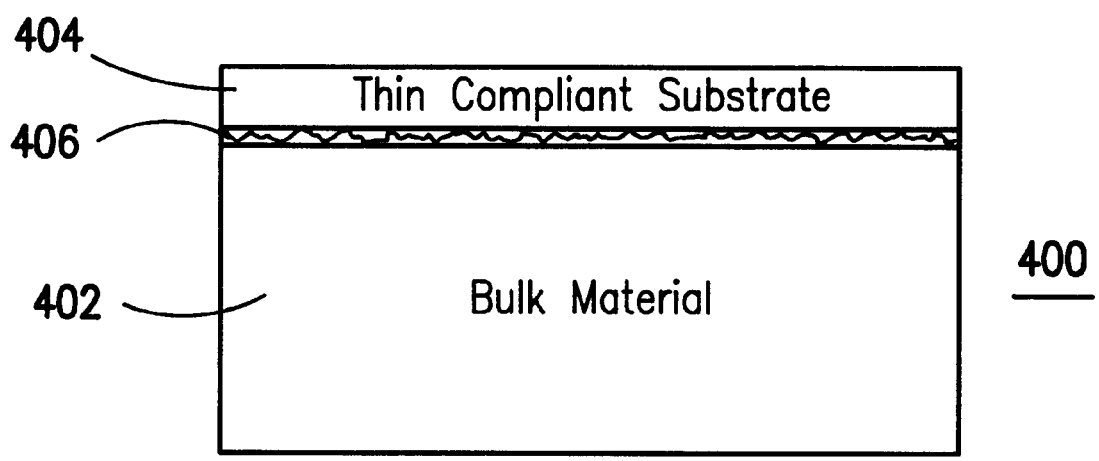
FIG. 7 is a schematic illustration of a CU substrate constructed in accordance with a fourth preferred embodiment of the present invention.

An experiment on wafer bonding shows that surface roughness could reduce the actual contact surface area and result in voids at the bonding interface when the surface features are greater than the migration length of the surface atoms at the bonding temperature. This property is employed in a further embodiment of the present invention to form a CU substrate 400 by reducing the bonding energy between a thick bulk material base layer 402 and a thin compliant substrate layer 404 as illustrated in FIG. 7. In this embodiment, a roughened top surface 406 of the base layer 402 is employed as bonding interface between the base layer 402 and the substrate layer 404.

There are many ways to create microscopic surface roughness for different materials. For example, dipping silicon wafers in KOH solution or immersing them in still, uncirculated D.I. water can create a surface roughness of from tens of to a few hundred angstroms, as characterized by atomic force microscopy (AFM). Bonding thin films to such microscopically roughened surfaces in an oxygen-free environment results in surface energy being approximately proportional to the actual surface contact area, which should decrease with the increasing root-mean-square of the surface roughness. When the bonding is performed in atmosphere, the formation of surface oxide at the interface may change the bonding energy but its value should still be lower than the value for a homogeneous, single crystal interface. For other materials, such as III-V compound semiconductors, the high atomic surface mobility may smooth the surface roughness during bonding by the so called mass transport effect. Proper bonding conditions and surface treatments may suppress the mass transport effect. For example, it is well known that the supply of arsine and phosphine help preserve the surface features on GaAs and InP at high temperature in a technique often used in epitaxial growth on fine corrugated structures. Similar methods can be used to achieve the desired surface bonding energy at the microscopically roughened surface.

In summary, the present invention provides CU substrates which may be formed from conventional semiconductor and other bulk materials, but which facilitate growth of highly lattice mismatched, though defect-free, epitaxial layers thereon. This is accomplished through provision of the thin substrate layer which is highly flexible due to the decreased bonding energy of the atoms therein which results from bonding of the thin film substrate layer using any of the previously discussed techniques to the bulk material base layer. The present invention thereby facilitates the formation of a wide range of devices which were previously not feasible to construct due to lattice matching constraints. As examples, following is a list of some potential applications of the CU substrate technology:

(1) Hall Effect Motion/Vibration Sensors

This is achieved by growing high mobility InSb thin layers on semi-insulating GaAs CU substrates (with a 14.7% lattice mismatch).

(2) Solar Cells

Growing GaAs or other compound semiconductor solar cells on Si CU substrates can achieve high efficiency (e.g., greater than 20%), light weight and low cost. The devices may be used for satellite and other aerospace applications.

(3) Mid-Infrared and Far-Infrared Lasers and Detectors

Materials, such as GaSb, InSb, InAs and their ternary and quaternary compounds, such as InAsSb, can be grown on GaAs CU substrates to produce lasers and detectors operating at 2–12 $\mu$m wavelength regimes.

(4) High-Efficiency Visible LEDs

The red, orange and yellow/green LEDs can be achieved through growth of InGaAlP compounds on GaAs CU substrates. LEDs from red to UV wavelengths can be realized with InGaN and GaAlN compounds grown on Si, GaAs or other CU substrates. The CU substrates are more attractive than the sapphire substrates currently being used from both cost and electrical property standpoints.

(5) High-Speed Si Electronic Circuits

One of the most promising approaches to enhance the performance of Si transistors in the Si industry is by using strained Si thin layers deposited on SiGe alloys as channels for the transistors. The prerequisite for this approach is the ability to form a relaxed SiGe layer on Si without threading dislocations. This requirement has not been met with other schemes and can be met by using Si CU substrates.

(6) Ultra-High Performance Transistors

Low bandgap semiconductors, such as InSb and InAs, have an extremely high mobility, which is desirable for high speed electronic circuits. Such ultra-high speed devices can now be fabricated on CU substrates.

(7) Visible and UV Laser Diodes

InGaAlN/InGaN containing 0 to 100% In can be grown on CU substrates (e.g., GaAs-Si, GaAs-sapphire, SiC-Si, Si-Si, etc.) to achieve current injection visible and UV lasers which are important for display, optical data storage and biomedical applications.

(8) High-Power, High Voltage Electronic Circuits

Transistors made of GaN and SiC compounds can sustain high voltage (the breakdown voltage is typically 10 times of the GaAs breakdown voltage) and can deliver high power. These are attractive features for the power industry and the microwave communications industry. The quality of GaN and SiC compounds grown on CU substrates is expected to be superior to that of other mismatched substrates in both their carrier mobility and breakdown voltage.

(9) Optoelectronic Integrated Circuits and Electronic Circuits with Mixed Materials These may include OEICs on silicon, circuits with III-V and Si transistors, and circuits with heterojunction bipolar transistors and field effect transistors, etc.

(10) 1.3/1.55 Micron Vertical Cavity Surface-Emitting Lasers (VCSELs)

By growing InGaAs/InAlAs Bragg mirrors (about 20% In for 1.3 $\mu$m VCSELs and a higher In composition for 1.55 $\mu$m VCSELs) on GaAs CU substrate and InGaAs (higher In composition) quantum wells, monolithic 1.3/1.55 $\mu$m VCSELs can be made. These VCSELs are important for high-speed data link, local area access optical network, subscriber loop, optical communication and gas sensing applications.

(11) Near Infrared (1 to 1.6 $\mu$m) Semiconductor Lasers

Without the technology of the present invention, materials used to fabricate these devices have to be grown on more expensive, smaller sized and more brittle InP substrates. They can now be fabricated on GaAs or Si CU substrates constructed in accordance with the present invention.

Although the present invention has been disclosed in terms of a number of preferred embodiments, it will be understood that numerous additional modifications and variations could be made thereto without departing from the scope of the invention as defined by the following claims.

I claim:

1. A substrate for growth of high quality epitaxial layers comprising:
   a) a base layer; and
   b) a thin substrate layer bonded at a bonding interface to said base layer, said bonding interface containing atoms having a bonding energy lower than the bonding energy of atoms in either said base layer or said substrate layer.

2. The substrate of claim 1, wherein said thin substrate layer has a thickness of approximately 20 nm or less.

3. The substrate of claim 1, wherein said base layer is formed from material selected from the group comprising Si, GaAs, InP, SiC and GaP.

4. The substrate of claim 1, wherein said substrate layer is bonded to said base layer with a crystal orientation of said substrate layer being disposed at an angle relative to a crystal orientation of said base layer to thereby form a plurality of screw dislocations or a coincident lattice site between said substrate layer and said base layer, thereby reducing the bonding energy of said atoms in said bonding interface.

5. The substrate of claim 4, wherein said angle is about a vertical axis passing perpendicularly through said base and substrate layers, whereby said substrate layer is rotated relative to said base layer to thereby form a twist boundary between said substrate layer and said base layer.

6. The substrate of claim 4, wherein said angle is about a horizontal axis passing through said base and said substrate layers, whereby said crystal orientation of said substrate layer is tilted relative to said crystal orientation of said base layer.

7. The substrate of claim 1, wherein said base layer has a roughened top surface, and said substrate layer is bonded to said roughened top surface.

8. The substrate of claim 1, wherein said base layer has a patterned top surface, and said substrate layer is bonded to said patterned top surface.

9. The substrate of claim 1, wherein said base layer has a porous top surface, and said substrate layer is bonded to said porous top surface.

10. The substrate of claim 1, further comprising an interfacial layer formed in said bonding interface between said substrate and base layers.

11. A method for fabricating a substrate for growth of defect-free epitaxial layers, said method comprising the steps of:
   a) providing a base layer formed from a material;
   b) bonding a thin substrate layer to said base layer, said thin layer having a thickness less than or equal to approximately 20 nm, said bonding being selected to reduce the bonding energy of atoms in a bonding interface formed between said base layer and said thin substrate layer below the bonding energy of atoms disposed in either said base layer or said substrate layer so that said substrate layer is compliant and can absorb stresses and strains imparted thereto by a mismatched epitaxial layer growth thereon.

12. The method of claim 11, wherein said step of bonding further comprises bonding said thin substrate layer to said base layer with a crystal orientation of said substrate layer being positioned at an angle relative to a crystal orientation of said base layer to thereby reduce the bonding energy between said substrate layer and said base layer.

13. The method of claim 12, wherein said angle is selected about a vertical axis passing through said substrate and base layers, whereby said substrate layer is rotated relative to the said base layer to thereby form a twist boundary between said base layer and said substrate layer.

14. The method of claim 12, wherein said angle is selected about a horizontal axis passing through said base and substrate layers, whereby the crystal orientation of said substrate layer is tilted about a vertical axis relative to the crystal orientation of said base layer.

15. The method of claim 12, further comprising the step of forming at least a first epitaxial layer on said substrate layer, said epitaxial layer being formed from a material that is lattice mismatched with a material from which said substrate layer is formed.

16. The method of claim 15, wherein the step of providing a base layer further comprises providing a base layer formed from a material selected from the group comprising Si, GaAs, InP, SiC or GaP.

17. The method of claim 15, wherein said step of forming at least a first epitaxial layer further causes the angle between the crystal orientation of said substrate layer and said base layer to be reduced to substantially zero.

18. The method of claim 11, wherein said step of providing a base layer further comprises providing a base layer having a porous top surface thereon to reduce the bonding energy between said substrate layer and said base layer.

19. The method of claim 11, further comprising the step of patterning a top surface of said base layer prior to bonding of said substrate layer to said base layer to thereby reduce the bonding energy between said substrate layer and said base layer.

20. The method of claim 19, wherein said step of patterning further comprises:
   1) depositing a self-organized pattern of material on said top surface of said base layer; and
   2) etching said top surface to transfer said pattern into said top surface.

21. The method of claim 11, further comprising the step of roughening said top surface of said base layer prior to bonding said substrate layer to said base layer to reduce the bonding energy between said substrate layer and said base layer.

22. The method of claim 21, wherein the step of roughening comprises exposing said top surface to a liquid selected from the group comprising KOH solution and deionized water.

23. The method of claim 11, further comprising the step of forming at least a first epitaxial layer on said substrate layer, said epitaxial layer being formed of a material which is lattice mismatched with a material from which said substrate layer is formed.

24. The method of claim 11, wherein the step of providing a base layer further comprises providing a base layer formed from a material selected from the group comprising Si, GaAs, InP, SiC or GaP.

* * * * *

UNITED STATES PATENT AND TRADEMARK OFFICE
CERTIFICATE OF CORRECTION

PATENT NO. : 5,981,400
DATED : November 9, 1999
INVENTOR(S) : Yu-Hwa Lo

It is certified that error appears in the above-identified patent and that said Letters Patent is hereby corrected as shown below:

Add the following claims:

25. A substrate for growth of high quality epitaxial layers comprising:
a) a base layer; and
b) a thin substrate layer bonded to said base layer with a crystal orientation of said substrate layer being disposed at an angle relative to a crystal orientation of said base layer to thereby form a plurality of screw dislocations or a coincident lattice site between said substrate layer and said base layer;
whereby, said substrate layer is compliant and can absorb stresses and strains imparted thereto by a mismatched epitaxial layer growth thereon.

26. The substrate of claim 25, wherein said angle is about a vertical axis passing perpendicularly through said base and substrate layers, whereby said substrate layer is rotated relative to said base layer to form a twist boundary between said substrate layer and said base layer.

27. The substrate of claim 25, wherein said angle is about a horizontal axis passing through said base and said substrate layers, whereby said crystal orientation of said substrate layer is tilted relative to said crystal orientation of said base layer.

28. The substrate of claim 25, further comprising an interfacial layer formed in a bonding interface between said substrate layer and said base layer.

29. The substrate of claim 25, wherein said substrate layer has a thickness of 20 nm or less.

UNITED STATES PATENT AND TRADEMARK OFFICE
CERTIFICATE OF CORRECTION

PATENT NO. : 5,981,400
DATED : November 9, 1999
INVENTOR(S) : Yu-Hwa Lo

It is certified that error appears in the above-identified patent and that said Letters Patent is hereby corrected as shown below:

30. The substrate of claim 25, wherein said base layer is formed from material selected from the group comprising Si, GaAs, InP, SiC and GaP.

31. The substrate of claim 25, wherein said base layer and said substrate layer are formed from the same material.

32. The substrate of claim 25, wherein said substrate layer and said base layer are formed from different materials.

33. The substrate of claim 32, wherein said substrate layer is formed from GaAs and said base layer is formed from InP or Si.

34. The substrate of claim 32, wherein said substrate layer is formed from SiC and said base layer is formed from Si.

35. A substrate for growth of high quality epitaxial layers comprising:
a) a base layer, said base layer having a top surface that has been treated to reduce an effective surface area thereof; and
b) a thin substrate layer bonded to said top surface of said base layer;
whereby, said substrate layer is compliant and can absorb stresses and strains imparted thereto by a mismatched epitaxial layer growth thereon.

36. The substrate of claim 35, wherein said treated top surface of said base layer is roughened.

37. The substrate of claim 35, wherein said treated top surface of said base layer is patterned.

UNITED STATES PATENT AND TRADEMARK OFFICE
CERTIFICATE OF CORRECTION

PATENT NO. : 5,981,400
DATED : November 9, 1999
INVENTOR(S) : Yu-Hwa Lo

It is certified that error appears in the above-identified patent and that said Letters Patent is hereby corrected as shown below:

38. The substrate of claim 35, wherein said treated top surface of said base layer is porous.

39. The substrate of claim 35, further comprising an interfacial layer formed in a bonding interface between said substrate layer and said base layer.

40. The substrate of claim 35, wherein said substrate layer has a thickness of 20 nm or less.

41. The substrate of claim 35, wherein said base layer is formed from material selected from the group comprising Si, GaAs, InP, SiC and GaP.

42. The substrate of claim 35, wherein said base layer and said substrate layer are formed from the same material.

43. The substrate of claim 35, wherein said substrate layer and said base layer are formed from different materials.

44. The substrate of claim 43, wherein said substrate layer is formed from GaAs and said base layer is formed from InP or Si.

45. The substrate of claim 43, wherein said substrate layer is formed from SiC and said base layer is formed from Si.

UNITED STATES PATENT AND TRADEMARK OFFICE
CERTIFICATE OF CORRECTION

PATENT NO. : 5,981,400
DATED : November 9, 1999
INVENTOR(S) : Yu-Hwa Lo

It is certified that error appears in the above-identified patent and that said Letters Patent is hereby corrected as shown below:

46. A method for fabricating a substrate for growth of defect-free epitaxial layers, said method comprising the steps of:
 a) providing a base layer formed from a material; and
 b) bonding a thin substrate layer to said base layer with a crystal orientation in said substrate layer being positioned at an angle relative to a crystal orientation in said base layer, whereby said substrate layer is compliant and can absorb stresses and strains imparted thereto by a mismatched epitaxial layer growth thereon.

47. The method of claim 46, wherein said angle is selected about a vertical axis passing through said substrate and base layers, whereby said substrate layer is rotated relative to said base layer to thereby form a twist boundary between said base layer and said substrate layer.

48. The method of claim 46, wherein said angle is selected about a horizontal axis passing through said base and substrate layers, whereby the crystal orientation of said substrate layer is tilted about a vertical axis relative to the crystal orientation of said base layer.

49. The method of claim 46, further comprising the step of forming at least a first epitaxial layer on said substrate layer, said epitaxial layer being formed from a material that is lattice mismatched with a material from which said substrate layer is formed.

50. The method of claim 49, wherein said step of forming at least a first epitaxial layer further causes the angle between the crystal orientation of said substrate layer and said base layer to be reduced to substantially zero.

51. The method of claim 46, wherein the step of providing a base layer further comprises providing a base layer formed from a material selected from the group comprising Si, GaAs, InP, SiC and GaP.

UNITED STATES PATENT AND TRADEMARK OFFICE
CERTIFICATE OF CORRECTION

PATENT NO. : 5,981,400
DATED : November 9, 1999
INVENTOR(S) : Yu-Hwa Lo

It is certified that error appears in the above-identified patent and that said Letters Patent is hereby corrected as shown below:

52. The method of claim 46, wherein said base layer and said substrate layer are formed from the same material.

53. The method of claim 46, wherein said substrate layer and said base layer are formed from different materials.

54. The method of claim 53, wherein said substrate layer is formed from GaAs and said base layer is formed from InP or Si.

55. The method of claim 53, wherein said substrate layer is formed from SiC and said base layer is formed from Si.

56. The method of claim 46, wherein said step of bonding further comprises:
    1) providing a second base layer of material;
    2) forming an etch stop layer on a top surface of said second base layer;
    3) forming said thin substrate layer on a top surface of said etch stop layer, said thin substrate layer having an exposed surface;
    4) bonding said exposed surface of said thin substrate layer to said top surface of said first base layer with a crystal orientation in said substrate layer being positioned at an angle relative to a crystal orientation in said first base layer; and
    5) removing said second base layer from said thin substrate layer.

UNITED STATES PATENT AND TRADEMARK OFFICE
CERTIFICATE OF CORRECTION

PATENT NO. : 5,981,400
DATED : November 9, 1999
INVENTOR(S) : Yu-Hwa Lo

It is certified that error appears in the above-identified patent and that said Letters Patent is hereby corrected as shown below:

57. A method for fabricating a substrate for growth of defect-free epitaxial layers, said method comprising the steps of:
   a) providing a first base layer formed from a material;
   b) treating a top surface of said base layer to reduce an effective surface area of said top surface; and
   c) bonding a thin substrate layer to said top surface of said base layer, whereby said substrate layer is compliant and can absorb stresses and strains imparted thereto by a mismatched epitaxial layer growth thereon.

58. The method of claim 57, wherein said top surface of said base layer is made porous by said treating step.

59. The method of claim 57, wherein said treating step comprises the step of patterning said top surface of said base layer.

60. The method of claim 59, wherein said step of patterning further comprises:
   1) depositing a self-organized pattern of material on said top surface of said base layer; and
   2) etching said top surface to transfer said pattern into said top surface.

61. The method of claim 57, wherein said treating step comprises the step of roughening said top surface of said base layer.

62. The method of claim 61, wherein the step of roughening comprises exposing said top surface of said base layer to a liquid selected from the group comprising KOH solution and deionized water.

UNITED STATES PATENT AND TRADEMARK OFFICE
CERTIFICATE OF CORRECTION

PATENT NO. : 5,981,400
DATED : November 9, 1999
INVENTOR(S) : Yu-Hwa Lo

It is certified that error appears in the above-identified patent and that said Letters Patent is hereby corrected as shown below:

63. The method of claim 57, further comprising the step of forming at least a first epitaxial layer on said substrate layer, said epitaxial layer being formed of a material which is lattice mismatched with a material from which said substrate layer is formed.

64. The method of claim 57, wherein the step of providing a base layer further comprises providing a base layer formed from a material selected from the group comprising Si, GaAs, InP, SiC and GaP.

65. The method of claim 57, wherein said base layer and said substrate layer are formed from the same material.

66. The method of claim 57, wherein said substrate layer and said first base layer are formed from different materials.

67. The method of claim 66, wherein said substrate layer is formed from GaAs and said first base layer is formed from InP or Si.

68. The method of claim 66, wherein said substrate layer is formed from SiC and said first base layer is formed from Si.

UNITED STATES PATENT AND TRADEMARK OFFICE
CERTIFICATE OF CORRECTION

PATENT NO. : 5,981,400
DATED : November 9, 1999
INVENTOR(S) : Yu-Hwa Lo

It is certified that error appears in the above-identified patent and that said Letters Patent is hereby corrected as shown below:

69. The method of claim 57, wherein said step of bonding further comprises:
 1) providing a second base layer of material;
 2) forming an etch stop layer on a top surface of said second base layer;
 3) forming said thin substrate layer on a top surface of said etch stop layer, said thin substrate layer having an exposed surface;
 4) bonding said exposed surface of said thin substrate layer to said top surface of said first base layer; and
 5) removing said second base layer from said thin substrate layer.

Signed and Sealed this

Ninth Day of May, 2000

*Attest:*

Q. TODD DICKINSON

*Attesting Officer*   *Director of Patents and Trademarks*